United States Patent [19]

Clabes et al.

[11] Patent Number: 5,321,977
[45] Date of Patent: Jun. 21, 1994

[54] INTEGRATED TIP STRAIN SENSOR FOR USE IN COMBINATION WITH A SINGLE AXIS ATOMIC FORCE MICROSCOPE

[75] Inventors: Joachim Clabes; Henri A. Khoury, both of Yorktown Heights; Laszlo Landstein, Ossining, all of N.Y.

[73] Assignee: International Business Machines Corporation, Armonk, N.Y.

[21] Appl. No.: 999,059

[22] Filed: Dec. 31, 1992

[51] Int. Cl.⁵ .................. G01N 27/00; G01N 23/00
[52] U.S. Cl. ............................ 73/105; 250/306; 250/307
[58] Field of Search .................. 73/105; 250/306, 307

[56] References Cited

U.S. PATENT DOCUMENTS

| | | | |
|---|---|---|---|
| 4,343,993 | 8/1982 | Binnig et al. | 250/306 |
| 4,506,154 | 3/1985 | Scire | 250/442.1 |
| 4,724,318 | 2/1988 | Binnig | 250/307 |
| 4,806,755 | 2/1989 | Duerig et al. | 250/306 |
| 4,851,671 | 7/1989 | Pohl | 250/306 |
| 4,851,767 | 7/1989 | Halbourt et al. | 324/158 P |
| 4,883,959 | 11/1989 | Hosoki et al. | 250/306 |
| 4,888,550 | 12/1989 | Reid | 324/158 P |
| 4,902,892 | 2/1990 | Okayama et al. | 250/307 |
| 4,916,315 | 4/1990 | Otaka | 250/310 |
| 4,918,309 | 4/1990 | Beha et al. | 250/306 |
| 4,924,091 | 5/1990 | Hansma et al. | 250/306 |
| 4,924,713 | 5/1990 | Machino et al. | 73/862.06 |
| 5,092,163 | 3/1992 | Young | 73/105 |
| 5,162,653 | 11/1992 | Hosaka et al. | 250/306 |
| 5,186,041 | 2/1993 | Nyyssonen | 73/105 |
| 5,196,701 | 3/1993 | Foster et al. | 250/307 |

FOREIGN PATENT DOCUMENTS

0413040A1 2/1991 European Pat. Off. .
0413041A1 2/1991 European Pat. Off. .
01224603 9/1989 Japan .

OTHER PUBLICATIONS

Tortonese et al. "Atomic Force Microscopy Using a Piezoresistive Cantilever," presented at Transducers '91, Stanford, Calif., Mar. 1991 four pages plus cover.
J. Vac. Sci. Technol B7 (6), K. L. Lee et al. "Direct electron-beam patterning for nanolithography," Nov./Dec. 1989, pp. 1941-1946.

Primary Examiner—Hezron E. Williams
Assistant Examiner—George Dombroske
Attorney, Agent, or Firm—Whitham & Marhoefer

[57] ABSTRACT

An integrated tip strain sensor is combination with a single axis atomic force microscope (AFM) for determining the profile of a surface in three dimensions. A cantilever beam carries an integrated tip stem on which is deposited a piezoelectric film strain sensor. A high-resolution direct electron beam (e-beam) deposition process is used to grow a sharp tip onto the silicon (Si) cantilever structure. The direct e-beam deposition process permits the controllable fabrication of high-aspect ratio, nanometer-scale tip structures. A piezoelectric jacket with four superimposed elements is deposited on the tip stem. The piezoelectric sensors function in a plane perpendicular to that of a probe in the AFM; that is, any tip contact with the linewidth surface will cause tip deflection with a corresponding proportional electrical signal output. This tip strain sensor, coupled to a standard single axis AFM tip, allows for three-dimensional metrology with a much simpler approach while avoiding catastrophic tip "crashes". Two-dimensional edge detection of the sidewalls is used to calculate the absolute value or the linewidth of overlay, independent of the AFM principle. The technique works on any linewidth surface material, whether conductive, non-conductive or semiconductive.

14 Claims, 4 Drawing Sheets

INTEGRATED TIP STRAIN SENSOR FOR USE IN COMBINATION WITH A SINGLE AXIS ATOMIC FORCE MICROSCOPE

CROSS-REFERENCE TO RELATED APPLICATIONS

This patent application is related to U.S. patent application Ser. No. 07/568,451, filed Aug. 16, 1990, entitled "Method of Producing Ultrafine Silicon Tips for the AFM/STM Profilometry", U.S. patent application Ser. No. 07/608,043, filed Oct. 31, 1990, entitled "Nanometer Scale Probe for an Atomic Force Microprobe, and Method for Making Same", U.S. patent application Ser. No. 07/619,378, entitled "Microprobe-Based CD Measurement Tool", and U.S. patent application Ser. No. 07/767,300, filed Sep. 27, 1991, entitled "Combined Scanning Force Microscope and Optical Metrology Tool", and which are all assigned to the same assignee as this application, and the disclosure of all of them is incorporated herein by reference.

BACKGROUND OF THE INVENTION

1. Field of the Invention

The present invention generally relates to metrology of linewidths, trenches and overlays on a submicron range using strain sensors and, more particularly, to probe assembly used in combination with an Atomic Force Microscope (AFM) for making measurements in three dimensions. The AFM is used to make measurements in the z direction and then the probe assembly is used in the x-y plane perpendicular to the z direction to profile a sample.

2. Description of the Prior Art

Quality control in the manufacture of integrated circuits (ICs) requires a technology for measuring surface geometries of the IC wafer. One such technology employs a small thin piezoelectric member affixed to a larger mounting member to which there is attached a probe tip. The probe tip is made to contact the surface being mapped thereby causing a flexing of the mounting member and a corresponding flexing of the piezoelectric member, producing an electrical signal. An example of this technology is shown in U.S. Pat. No. 4,888,550 to Reid which discloses a multiprobe tip assembly used for quality control testing of an integrated circuit wafer. The Reid device uses a strain sensing piezoelectric element at the base supporting the entire tip structure and, because of this construction, is limited to sensing only in the vertical direction.

In practice, the contact tip technology as known in the prior art has been useful in measuring micron scale or larger structures. Furthermore, the sensitivities of these structures has been relatively low, making them unsuitable for measurements of submicron scale structures such as those of the newer gigabit chips.

Scanning Tunneling Microscopy (STM) technology introduced a new concept in measurements using a probe type approach to map the surfaces of integrated circuit structures. The basic STM is disclosed in U.S. Pat. No. 4,343,993. Briefly described, a sharply pointed, electrically conductive tip is placed at a distance on the order of one nanometer from the conductive surface of a sample to be investigated, with an appropriate electrical potential applied across the gap between the tip and surface. As the electron clouds of the atoms at the apex of the tip and the surface touch, a flow of electrons will result giving rise to a tunneling current which happens to be extremely sensitive to changes in gap width. To render these changes as close as possible to zero, a feedback control system controls the distance of the tip from the surface, using deviations of the tunneling current from an initial value as a control signal. This control signal is also employed to generate a plot of the topography of the surface being investigated.

Atomic Force Microscopy (AFM) is a variation of the STM technology. In one design, a sensor consisting of a spring-like cantilever which is rigidly mounted at one end and carries at its free end a dielectric tip, profiles the surface of an object. The force between the object's surface and the tip deflects the cantilever, and this deflection can be accurately measured. A spatial resolution of 3 nm has been achieved.

Another version of the AFM includes optical detection instead of STM detection. In this version, a tungsten tip at the end of a wire is mounted on a piezoelectric transducer. The transducer vibrates the tip at the resonance frequency of the wire which acts as a cantilever, and a laser heterodyne interferometer accurately measures the amplitude of the a.c. vibration. The gradient of the force between the tip and the sample modifies the compliance of the lever, hence inducing a change in vibration amplitude due to the shift of the lever resonance. Knowing the lever characteristics, one can measure the vibration amplitude as a function of the tip-to-sample spacing in order to deduce the gradient of the force and, thus, the force itself.

A most critical component of the AFM is the spring-like cantilever. As a maximum deflection for a given force is needed, a cantilever is required which is as soft as possible. At the same time, a stiff cantilever with a high natural frequency is necessary in order to minimize the sensitivity to vibrational noise from the building. For meeting both requirements, dimensions of the cantilever beam are necessary that can only be obtained by microfabrication techniques. Another most critical component of the AFM is the tip itself. Tip "crashes" are the most likely failure cause of AFM tips, and such failures are catastrophic, requiring the replacement of the cantilever beam and tip subassembly. This is perhaps the greatest limitation to the use of AFM.

While STM and AFM both have the potential capability for profiling on an atomic diameter scale, the difficulty with both is the measurement of trenches in two dimensions. Both require sophisticated multi-connected interferometers to detect the two-dimensional tip motion and, for AFM to be useful as a reliable and accurate metrology tool, the sensor tip should be highly reproducible in the fabrication process and the tip shape should be known with high accuracy. Moreover, for profiling and critical dimension (CD) measurement of silicon (Si) memory trenches with submicron trenches with depths of 1 $\mu$m or more, nanometer-scale tip shapes with high aspect ratio will be required.

SUMMARY OF THE INVENTION

It is therefore an object of the present invention to provide a measurement technology which is capable of meeting the advanced metrology requirements imposed by the dimensions of gigabit chips.

It is another, more specific object of the invention to provide a strain sensor device in combination with an AFM that is capable of three-dimensional measurements of submicron geometries with high sensitivity.

It is a further object of the invention to provide an AFM measurement system which protects the tip of the cantilever from catastrophic "crashes".

According to the invention, there is provided a cantilever beam carrying an integrated tip stem on which is deposited a piezoelectric film strain sensor. A high-resolution direct electron beam (e-beam) deposition process is used to grow a sharp tip onto a silicon (Si) cantilever structure. The direct e-beam deposition process permits the controllable fabrication of high-aspect ratio, nanometer-scale structures. A piezoelectric jacket with four electrical contacts superimposed is deposited on the tip stem. The piezoelectric sensors function in a plane perpendicular to that of the probe in STM; that is, any tip contact with the linewidth surface will cause tip deflection with a corresponding proportional electrical signal output. This tip strain sensor, coupled to a standard single axis AFM tip, allows for three-dimensional metrology with a much simpler approach while avoiding catastrophic tip "crashes". The potential for a tip "crash" is detected by the electrical signal output from the strain sensor exceeding a predetermined threshold. When the threshold is exceeded, the feedback control system stops the movement of the tip and then backs the tip away from a surface feature with which it has come into contact. Two-dimensional edge detection of the sidewalls is used to calculate the absolute value of the linewidth or overlay, independent of the AFM principle. The technique works on any linewidth surface material, whether conductive, non-conductive or semiconductive.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
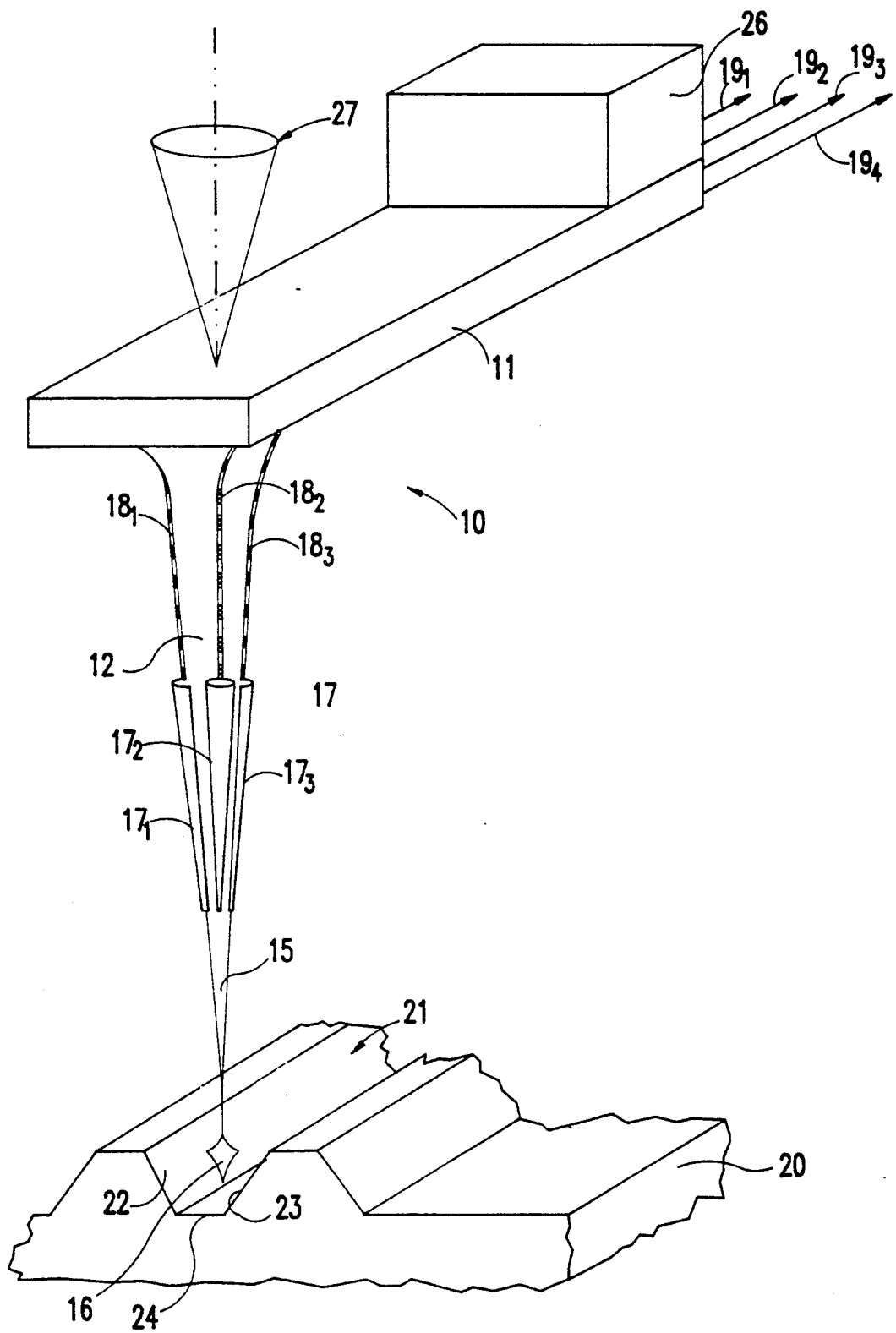
FIG. 1 is an isometric view showing a scanning probe tip attachment for a one-dimensional AFM system combined with a two-dimensional integrated tip strain sensor element according to the invention.

Referring now to the drawings, and more particularly to FIG. 1, there is shown the scanning probe tip attachment 10 for a one-dimensional AFM system (not shown). Starting with a standard cantilever beam 11 with an integrated tip stem 12, fabricated by micromachining techniques, the extended tip stem 15 and tip structure 16 is deposited by established e-beam techniques described, for example, by K. L. Lee and M. Hatzakis in "Direct electron-beam patterning for nanolithography", *J. Vac. Sci Technology*, November/December 1989, pp. 1941-1946. A piezoelectric film 17 is deposited on the tip stem 12 and divided into four quadrants by e-beam etching to define four piezoelectric sensors $17_1$, $17_2$, $17_3$, and $17_4$. The preferred implementation of this invention is to use lead zirconate titanate (PZT) material as the piezoelectric film 17 to construct the strain sensor elements $17_1$, $17_2$, $17_3$, and $17_4$, shown in more detail in FIG. 2. PZT material can be deposited with a variety of different processes known in the art, including rf-magnetron sputtering and chemical methods. Metal film is patterned to provide electrical conductors $18_1$, $18_2$, $18_3$, and $18_4$ which make electrical contact with respective strain sensor elements $17_1$, $17_2$, $17_3$, and $17_4$ and extend up the tip stem 12 and along the under surface of the cantilever beam 11, and from there electrical connections $19_1$, $19_2$, $19_3$, and $19_4$ are made to the measuring circuitry (not shown). The common base electrode for the strain sensor elements $17_1$, $17_2$, $17_3$, and $17_4$ can be either the tip stem 12 itself or a conductive coating, preferably Pt, or a conductive oxide. In either case, an insulative coating is provided to separate the conductive stem or coating from the electrical conductors $18_1$, $18_2$, $18_3$, and $18_4$. Additionally, a conductive path is provided as the common or return path to the measuring circuitry. The conductive coating, if used, and the corresponding common or return path are not shown in the drawings in order to simplify the illustration, but those skilled in the art will understand that the connection is implied.

Figure 2:
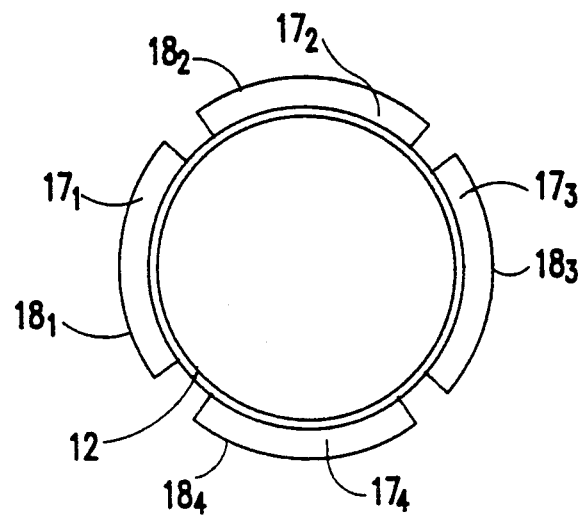
FIG. 2 is a cross-sectional view of the tip element shown in FIG. 1 showing the piezoelectric film divided into four quadrants and provided with overlying electrical contacts.

The implementation of the strain sensor elements $17_1$, $17_2$, $17_3$, and $17_4$ can be accomplished using different geometrical configurations, the configuration shown in FIGS. 1 and 2 being preferred. One specific reduction to practice is described below:

1. The stem 12 is first prepared by depositing an insulative layer of oxide, if the stem itself is the conductive return path for the sensors, or creating a conductive return path by depositing layers of a conductive coating (e.g., Pt or a conductive oxide) and an insulative layer.
2. A continuous PZT coating 17 is applied to the tip stem 15 and etched to form the four quadrant structure shown.
3. The deposited material is heat treated in an oxygen containing environment to crystalline into the proper PZT phase and to oxidize the exposed cantilever structure 11 and tip stem 12, achieving an electrical insulating coating on the same.
4. A continuous metal film is applied onto PZT coating 17 and at least the bottom surface of the cantilever beam 11 as an overcoat.
5. The metal film is patterned to yield the four quadrant contacts on the PZT coating 17 and the electrical conductors $18_1$, $18_2$, $18_3$, and $18_4$ which extend up the tip stem 12 and along the bottom length of the cantilever beam 11 to provide the output signal on lines $19_1$, $19_2$, $19_3$, and $19_4$ from the strain sensor contacts.

The patterning of the metal film into quadrant contacts and conducting lines is most conveniently accomplished by laser ablation, ion milling or e-beam processing.

Figure 3:
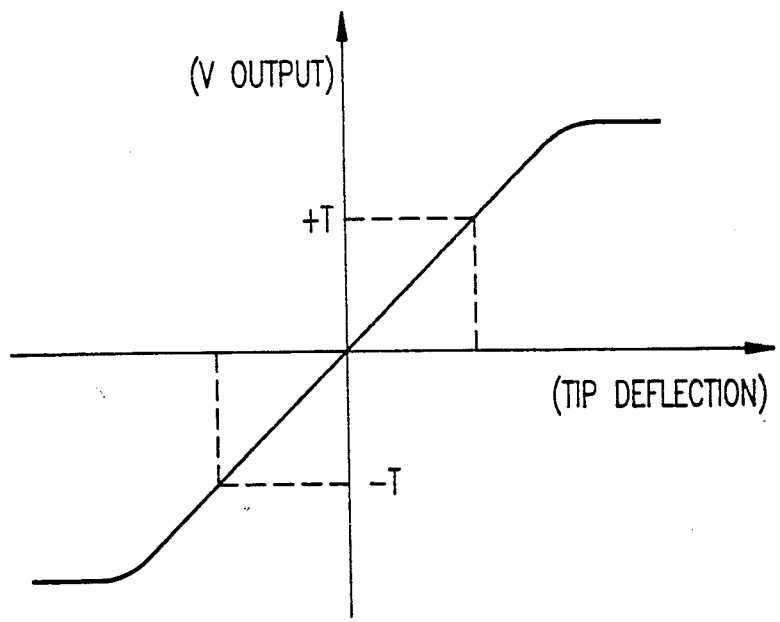
FIG. 3 is a graph showing a characteristic voltage output of the strain sensor elements as a function of tip lateral displacement in the X-axis and/or the Y-axis.

As shown in FIG. 1, the tip 16 extends into a trench 21 formed in the surface of a chip 20 which is to be profiled. The trench 21 has side walls 22 and 23 and a bottom 24. In operation, the system starts up as an AFM probe vibrating the tip 16 in the z direction and moving the tip from the surface to the bottom 24 of the trench 21. Vibration of the cantilever beam 11 is produced by a bimorphous crystal 26, and trench depth is defined by the AFM viewing the vibration of the end of the cantilever beam 11 via lens 27. At this point, tip vibration is terminated, the z dimension of the trench having been established. The tip is backed off from the surface (e.g., 20 to 80% of depth). The side walls are located by moving the tip in the x-y directions until strain is detected by the piezoelectric sensors due to tip deflection. FIG. 3 shows the voltage output for one of the piezoelectric sensors as a function of deflection of the tip 16. By a simple geometric calculation based on the relative amplitudes of the signals from each of the four sensors $17_1$, $17_2$, $17_3$, and $17_4$, the x and y coördinates are defined, and the tip 16 is moved to the opposite sidewall. When detected, the x and y coördinates of the opposite sidewall are also defined. Then, again using a simple geometric calculation, the linewidth or overlay is calculated.

Figure 4:
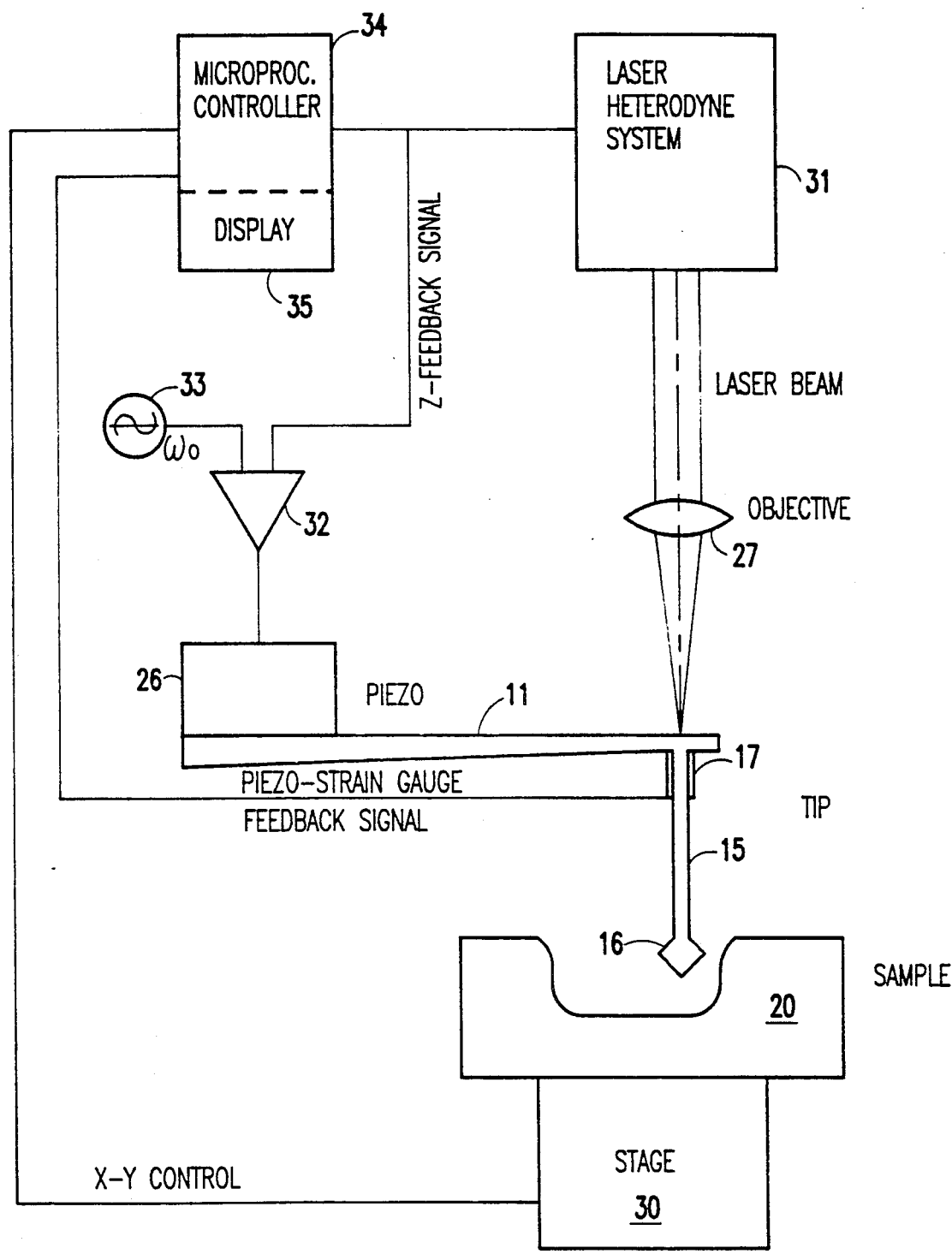
FIG. 4 is a block diagram showing the AFM system combined with the integrated tip strain sensor element.

FIG. 4 shows in block diagram form the overall system including the AFM. The chip 20 is mounted on a stage 30 for movement in the x-y plane. The AFM itself includes, in addition to the lens 27, a laser heterodyne system 31, the output of which is the z feedback signal to an amplifier 32 which provides an a.c. driving signal from generator 33 to the bimorphous crystal 26. The z feedback signal is also supplied to a microprocessor controller 34 which controls the application of the driving signal to the crystal 26, this being terminated when the z dimension has been determined. After the z dimension has been determined, the tip 16 is withdrawn to a predetermined distance above the bottom of the trench and moved relative to the trench in the x-y plane. This is accomplished by the controller 34 moving the stage 30. A feedback loop defined by the output signals from the sensors $17_1$, $17_2$, $17_3$, and $17_4$ to the controller 34 is used to control relative tip motion. The three dimensions determined in this fashion are output by the controller 34 to a suitable output device 35 which displays, prints and/or stores the data.

A most valuable and important part of the invention is its ability to prevent "crashes" of the tip. "Crash" prevention is accomplished by the microprocessor controller 34 including a programmed routine which compares the absolute value of the voltage output from the sensors $17_1$, $17_2$, $17_3$, and $17_4$ with a predetermined threshold. As generally indicated in FIG. 3, the absolute value of voltage is approximately a linear function of tip deflection, and the threshold is selected to correspond to a tip deflection well within elastic limit of the tip 15. The routine simply compares each of the outputs of the sensors $17_1$, $17_2$, $17_3$, and $17_4$ with the predetermined threshold. An alternative, although more complex routine, performs a simple trigonometric calculation on the two positive and two negative voltages from the sensors to resolve the direction of the tip deflection. Such a routine is part of the profiling computation performed by controller. The resolved absolute value of voltage amplitude is then compared to the threshold. When the threshold is exceeded, the controller 34 stops the motion of the tip 15 relative to the sample being profiled and then backs the tip away from the surface feature with which the tip has come into contact.

Figure 5:
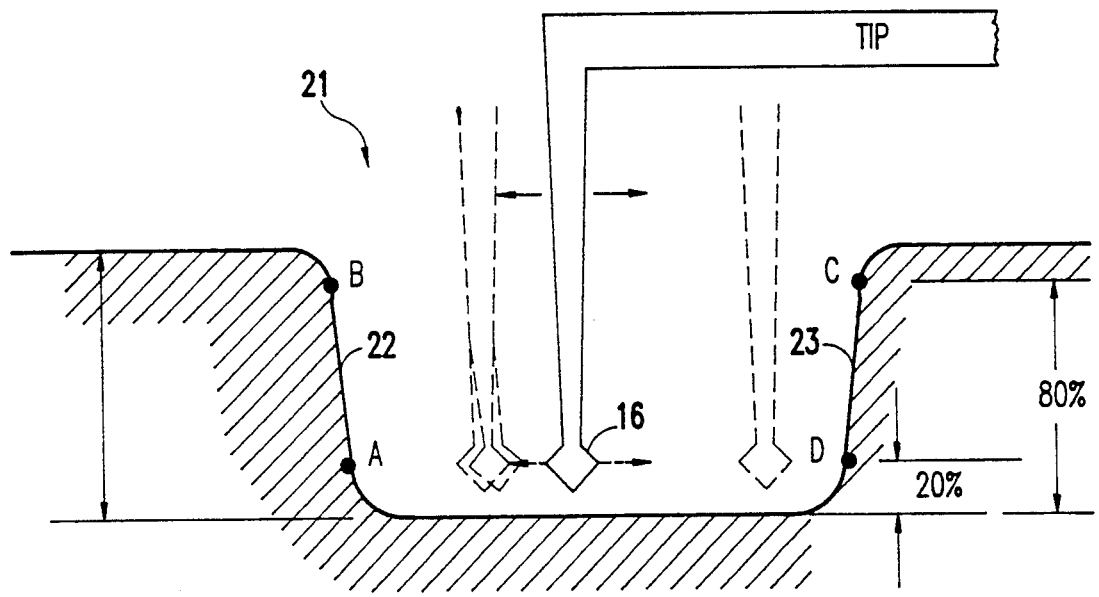
FIG. 5 is an enlarged view, partially in cross-section, showing the integrated tip strain sensor element within a trench and illustrating the operation of the system.

The preferred measurement regimen is illustrated in FIG. 5. After the z dimension is determined, the tip 16 is first withdrawn by 20% of the trench depth, and the x and y coördinates are determined for point A on side wall 22 and then point D on side wall 23. Then the tip 16 is withdrawn by 80% of the trench depth, and the x and y coördinates are determined for point B on side wall 22 and then point C on side wall 23. The calculated width of the trench 21 is based on the root mean square of the width AD and the width BC.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An integrated tip strain sensor in combination with an atomic force microscope (AFM) for profiling a surface in three dimensions comprising:
   a cantilever beam carrying a tip stem having a tip, said tip stem being an integrated tip stem;
   a piezoelectric film strain sensor on said integrated tip stem for sensing strain; and
   control means for selectively vibrating said cantilever in a first direction, said piezoelectric film strain sensor producing electrical signals in response to deflections of said tip due to contact of said tip with a surface feature,
   wherein said piezoelectric film strain sensor comprises a plurality of portions about said tip stem and means electrically connected to each of said portions for providing a feedback control signal to said control means.

2. The integrated tip strain sensor as recited in claim 1 wherein said piezoelectric film strain sensor comprises four quadrant portions about said tip stem.

3. The integrated tip strain sensor as recited in claim 2 wherein said cantilever beam and tip stem are made of silicon and a high-resolution direct electron beam (e-beam) deposition process is used to grow said tip onto said tip stem.

4. An integrated tip strain sensor as recited in claim 1, wherein said atomic force microscope comprises an atomic force microscope having at least one axis.

5. An integrated tip strain sensor as recited in claim 1, wherein said control means includes means for vibrating said cantilever in a z direction, said AFM including means for detecting cantilever vibrations to measure a distance in said z direction to a first surface feature, said control means thereafter stopping cantilever vibrations and relatively moving said tip with respect to said surface, said piezoelectric film strain sensor including means for producing electrical signals in response to deflections of said tip due to a second surface feature.

6. The integrated tip strain sensor recited in claim 5 wherein said control means includes threshold means for comparing said electrical signals generated by said piezoelectric film strain sensor in response to deflections of said tip, said threshold means stopping relative movement of said tip with respect to said surface to avoid a "crash" of said tip.

7. An integrated tip strain sensor as recited in claim 5, wherein said means for producing electrical signals includes metallized contacts electrically connected to each of said plurality of portions of said piezoelectric film strain sensor.

8. An integrated tip strain sensor as recited in claim 7, wherein said metallized contacts include means for providing a feedback control signal to said control means.

9. A probe for a metrology tool for measuring critical dimensions in a sample comprising:
   a tip stem on which is grown a tip, said tip stem being an integrated tip stem, wherein said integrated tip stem includes a piezoelectric film strain sensor, said piezoelectric film strain sensor having a plurality of portions and including means for generating electrical signals in response to respective deflections of said plurality of portions;

control means for moving said tip with respect to said surface; and feedback means including said control means responsive to said electrical signals generated in response to said respective deflections of said plurality of portions of said piezoelectric film strain sensor for controlling the movement of said tip.

10. The probe recited in claim 9 wherein said control means includes threshold means for comparing said electrical signals generated by said piezoelectric film strain sensor in response to deflections of said tip, said threshold means stopping relative movement of said tip with respect to said surface to avoid a "crash" of said tip.

11. The probe recited in claim 9 further comprising strain sensor means for sensing deflection of said tip, said feedback means including said strain sensor means.

12. The probe recited in claim 11, wherein said strain sensor means includes said piezoelectric film strain sensor, said piezoelectric film strain sensor being deposited on said integrated tip stem.

13. An integrated tip strain sensor in combination with an atomic force microscope (AFM) for profiling a surface in three dimensions comprising:

a cantilever beam carrying a tip stem having a tip, said tip stem being an integrated tip stem; and a piezoelectric film strain sensor on said integrated tip stem for sensing strain;

control means for vibrating said cantilever in a z direction, said AFM detecting cantilever vibrations to measure a distance in said z direction to a first surface feature, said control means thereafter stopping cantilever vibrations and relatively moving said tip with respect to said surface, said piezoelectric film strain sensor producing electrical signals in response to deflections of said tip due to said second surface feature, said control means x and y coordinates for said second feature, wherein said piezoelectric film strain sensor comprises four quadrant portions about said tip stem.

14. The integrated tip strain sensor as recited in claim 13, further comprising metallized contacts electrically connected to each of said quadrants and providing a feedback control signal to said control means, said cantilever beam and tip stem are made of silicon and a high-resolution direct electron beam (e-beam) deposition process is used to grow said sharp tip onto said tip stem.

* * * * *